(12) United States Patent
Park et al.

(10) Patent No.: US 6,639,735 B2
(45) Date of Patent: Oct. 28, 2003

(54) METHOD FOR MANUFACTURING AN OPTICAL DEVICE

(75) Inventors: Kyung-Hyun Park, Taejon (KR);
Jong-Hoi Kim, Taejon (KR);
Yong-Soon Baek, Taejon (KR);
Moon-Ho Park, Taejon (KR);
Sung-Bock Kim, Taejon (KR);
Kwang-Ryong Oh, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 264 days.

(21) Appl. No.: 09/927,221

(22) Filed: Aug. 10, 2001

(65) Prior Publication Data

US 2002/0085602 A1 Jul. 4, 2002

(30) Foreign Application Priority Data

Dec. 30, 2000 (KR) .................................. 2000-0086719

(51) Int. Cl.⁷ ................................................. G02B 3/08
(52) U.S. Cl. ......................... 359/741; 385/43; 438/31; 438/43; 216/2; 216/24
(58) Field of Search ................................. 359/722, 738, 359/741, 796; 385/43, 129; 216/2, 24; 438/31, 43

(56) References Cited

U.S. PATENT DOCUMENTS

| | | | | |
|---|---|---|---|---|
| 5,361,317 A | * | 11/1994 | Hartman et al. | 385/43 |
| 5,657,338 A | | 8/1997 | Kitamura | 372/50 |
| 5,720,893 A | | 2/1998 | Ben-Michael et al. | 216/24 |
| 5,732,177 A | * | 3/1998 | Deacon et al. | 385/122 |
| 6,238,943 B1 | * | 5/2001 | Kobayashi et al. | 438/31 |
| 6,465,269 B2 | * | 10/2002 | Furushima | 438/31 |
| 6,490,394 B1 | * | 12/2002 | Beall et al. | 385/39 |

OTHER PUBLICATIONS

"InP–Based Spotsize Converter for Integration with Switching Devices", IEEE Photonics Technology Letters, vol. 11, No. 1, Jan.,1999.

\* cited by examiner

*Primary Examiner*—Jordan M. Schwartz
(74) *Attorney, Agent, or Firm*—Blakely, Sokoloff, Taylor & Zafman (57) ABSTRACT

Disclosed is a method for the fabrication of a spot-size converter with a lateral-tapered waveguide (or an active layer), which utilizes a mask during a lithographic process wherein the mask has a pad that can absorb strain to be occurred during forming a lateral-tapered waveguide pattern at its distal end and the lateral-tapered waveguide is fabricated by forming the distal end on the order of about 0.6 $\mu$m in width followed by forming the lateral-tapered waveguide on the order of 0.1 $\mu$m using an wet etching. Thus, it is possible to reduce a fabrication cost because it is free from a high-resolution electron beam lithography and a stepper, and hence enhance a reproducibility of the lateral-tapered waveguide because it is free from an excessive wet etching during the use of a contact exposure equipment. Further, it is possible to integrate the spot-size converter fabricated by the above with an optical device, resulting in an increased position adjustment and reproducibility of the spot-size converter, which in turn, leads to increase in yield for the optical device.

14 Claims, 12 Drawing Sheets

METHOD FOR MANUFACTURING AN OPTICAL DEVICE

FIELD OF THE INVENTION

The present invention relates to a method for manufacturing an optical device; and, more particularly, to a method for manufacturing a spot-size converter (SSC) having sharp end tips for use in an optical communication by using distributed pads during the SSC formation.

DESCRIPTION OF THE PRIOR ART

As is well known, an optical device for use in an optical communication includes an optical fiber, a spot-size converter and a laser diode. A number of methods have been proposed over the years to implement an efficient coupling of the laser diode to the optical fiber because a light beam emitted from the laser diode looses its energy at an interface between the diode laser and the optical fiber.

In order to overcome the above-described problem, there has been proposed an optical device such as a tapered semiconductor structure appear to minimize a loss between the diode laser and the optical fiber. However, the process of manufacturing the tapered semiconductor structure is very complex and consequently requires high alignment accuracy. Therefore, there is a strong demand for manufacturing a tapered semiconductor structure having a small size end tip for removing a mode inconsistency between the optical elements.

Figure 1:
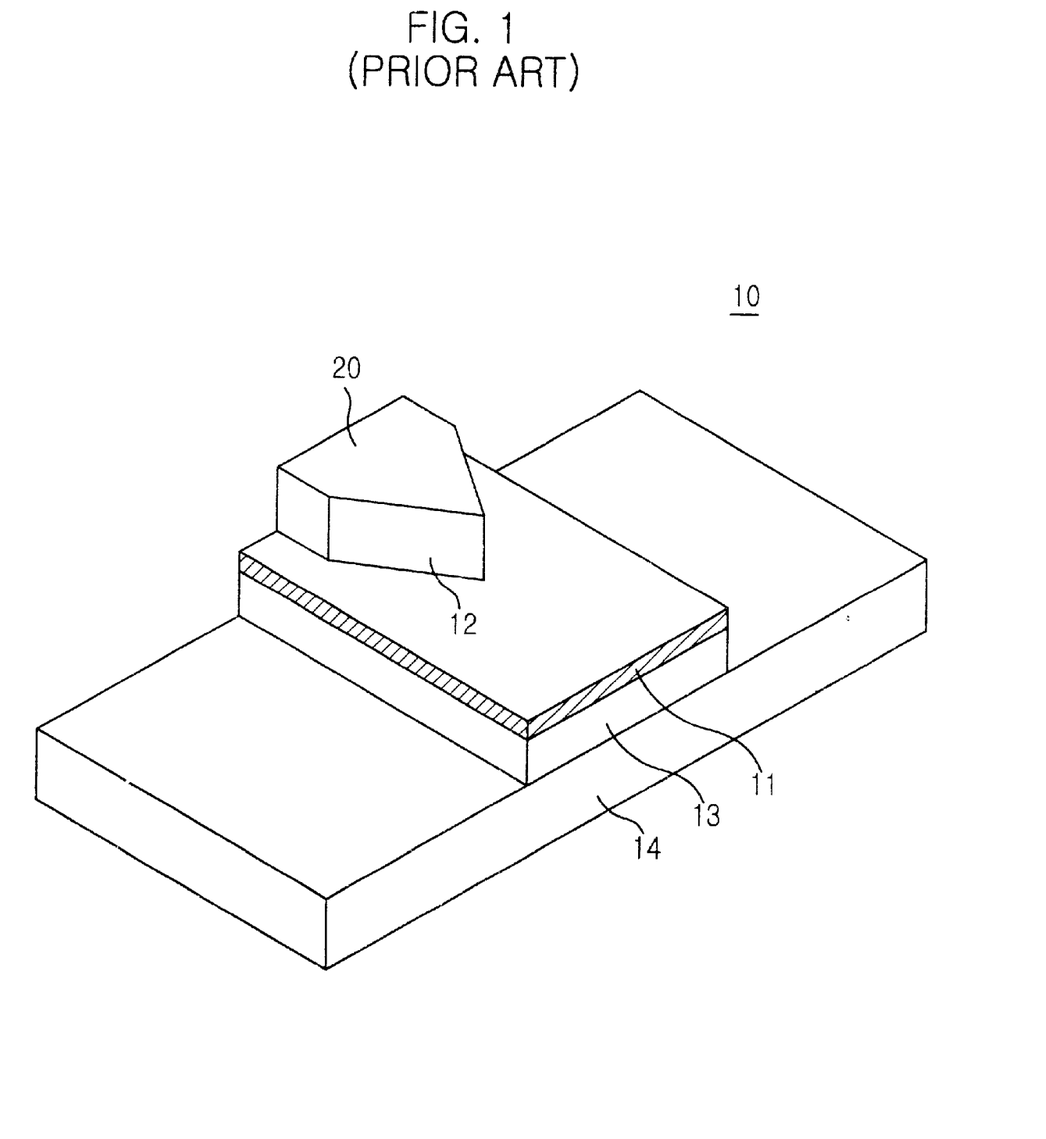
FIG. 1 is a perspective view showing a conventional tapered waveguide.

In FIG. 1, there is shown a cross sectional view setting forth a conventional semiconductor waveguide 10, disclosed n U.S. Pat. No. 5,720,893, entitled "TAPERED BEAM EXPANDER WAVEGUIDE INTEGRATED WITH A DIODE LASER". The semiconductor optical device 10 includes a first waveguiding layer 13 formed on top of a substrate, an etch stop layer 11 and a second waveguide layer 12.

The conventional semiconductor waveguide 10 must utilize two steps of patterning processes in order to obtain a lateral tapered structure. Specifically, a first knife-edge mask is applied to a left-section of the second waveguide layer 12, thereby removing a right-section of the second waveguide 12. After an etchant is deposited on the second waveguide layer 12, the right-section is etched away to leave only the left-section. Subsequently, a second knife-edge mask is applied to a portion 20 of the left-section. An etchant again deposited on the second waveguide layer 12 to etch away the remaining portion of the left-section. As a result of the etching of the remaining portion, the second waveguide layer 12 is now reduced to the area shown in FIG. 1 as the portion 20.

Even though the aforementioned semiconductor optical device 10 and the method for the manufacture thereof are capable of reducing its size of end tip, it still suffers from a bad adhesion at end portion of the second waveguide layer 12 and the stop etch layer 11 due to a strain caused by a photoresist layer formed thereabove.

Furthermore, since the patterned left-section of the second waveguide layer 12 has an oblique side wall and the amount of reflected light beam from an interface between the stop etch layer and the left-section of the second waveguide layer 12 is not uniform, the conventional method requires a very high alignment accuracy during the second patterning process.

These problems, therefore, tend to make it difficult to obtain the desired reproducibility, reliability and yield.

SUMMARY OF THE INVENTION

It is, therefore, an object of the present invention to provide a method for manufacturing an optical device for use in an optical communication, which utilizes a pair of strain distributed pads during the formation of a tapered structure, thereby reducing fabrication cost and increasing reproducibility, without utilizing a high resolution electron beam lithography and a stepper.

It is another object of the present invention to provide a method for the fabrication of a spot-size converter with a lateral-tapered structure, which is suitable to reduce a fabrication cost, increase a reproducibility and yield.

It is still another object of the present invention to provide an optical device, which is integrated with the spot-size converter fabricated by the above.

In accordance with one aspect of the present invention, there is provided a photolithography reticle for patterning a tapered pattern into an optical waveguide, which has a lateral-tapered shape at its both distal ends and a wide region of strain relaxation pad connected to the distal ends.

In accordance with another aspect of the present invention, there is provided a method for manufacturing an optical device, comprising the steps of: a) forming a waveguide layer on a semiconductor substrate; b) forming a mask layer and patterning the mask layer into a predetermined configuration in such a way that the predetermined configuration has a taper portion at its both distal ends and a pair of strain distributed pads; c) etching the waveguide layer using the patterned mask layer as an etching mask; and d) removing the patterned mask layer and subsequently removing portions of the waveguide layer corresponding to the strain distributed pads, thereby obtaining a tapered waveguide.

In accordance with still another aspect of the present invention, there is provided a method for the fabrication of a spot-size converter, comprising the steps of: a) forming a first waveguide layer, a first cladding layer, a second waveguide layer and a second cladding layer on a semiconductor substrate, sequentially; b) forming a mask layer on the second cladding layer and patterning the mask layer into a predetermined configuration in such a way that the predetermined configuration has a taper portion at its both distal ends and a pair of strain distributed pads; c) etching the second cladding layer and the second waveguide layer by using the patterned mask layer as an etching mask; and d) removing the patterned mask layer and subsequently removing portions of the second cladding layer and the second waveguide layer corresponding to the strain distributed pads, thereby obtaining a tapered waveguide on top of the first cladding layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 2A to 2D cross sectional views setting forth a method for manufacturing a tapered waveguide in accordance with a preferred embodiment of the present invention, respectively. FIG. 3 is a top plan view of a reticle, which is used during a photolithographic process.

Figure 2A:
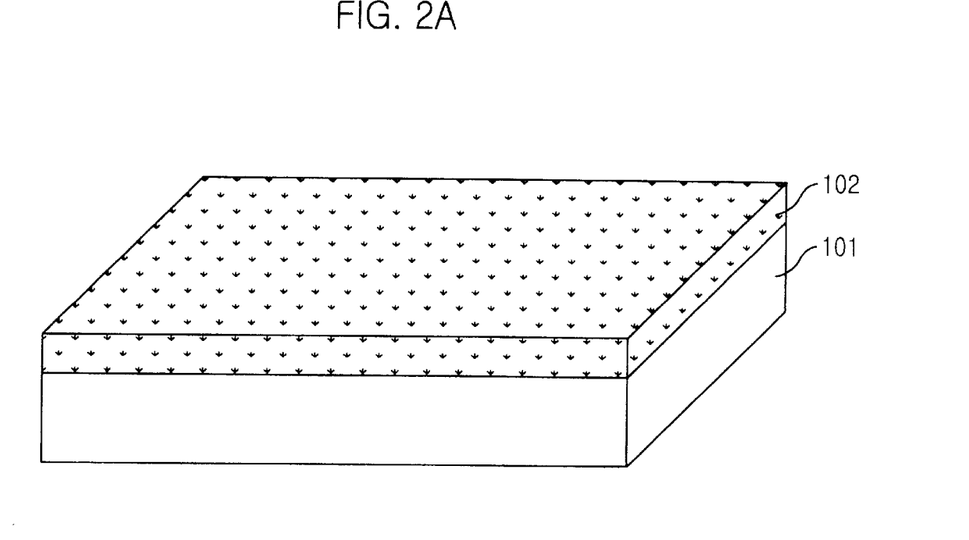
FIGS. 2A to 2D are cross sectional views setting forth a method for the fabrication of lateral-tapered waveguide in accordance with a preferred embodiment of the present invention, respectively.
Figure 3:
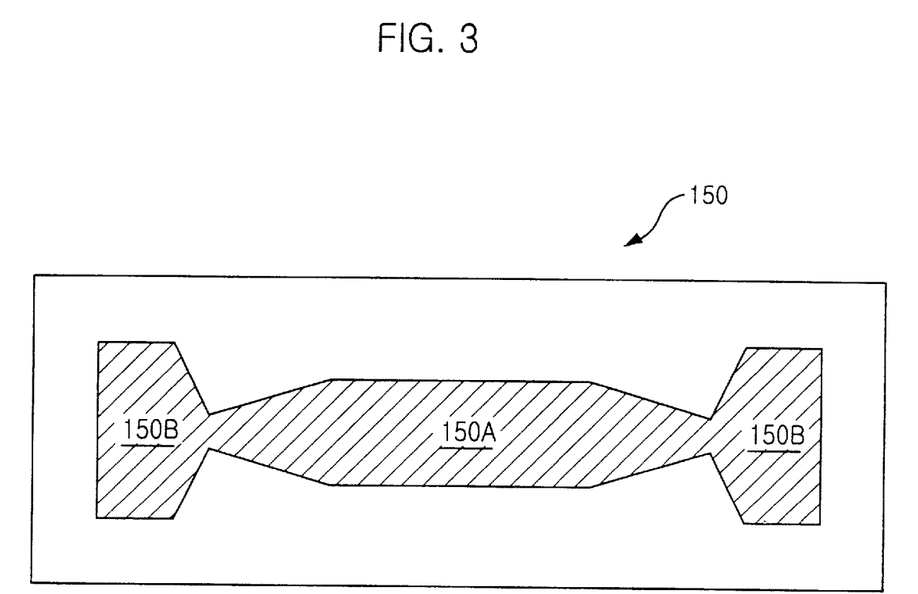
FIG. 3 is a top plan view of a mask, which is used during a photolithographic process.

In FIG. 2A, a waveguide layer 102 is formed on top of a semiconductor substrate 101.

Figure 2B:
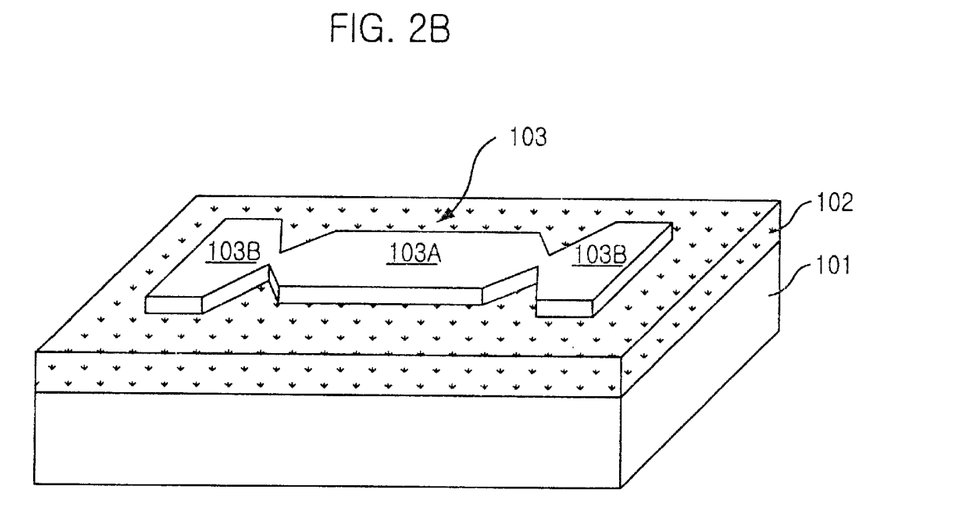

In an ensuing step, as shown in FIG. 2B, a photoresist layer is formed on the waveguide layer 102. The photoresist layer is patterned into a predetermined configuration by using a reticle 150 as shown in FIG. 3, thereby obtaining a patterned photoresist layer 103, as shown in FIG. 2B. In the preferred embodiment, the reticle 150 includes a lateral-tapered shape 150A and a pair of pads 150B, at its both distal ends, each of the pads being connected to the distal ends, respectively. The patterned photoresist layer 103 includes a lateral-tapered portion 103A and a pair of strain distributed pads 103B for distributing a strain generated by the patterning process.

The patterned photoresist layer 103 serves as a mask during the patterning process of the waveguide layer 102. Alternatively, a mask for patterning the waveguide layer 102 may be obtained by forming a silicon nitride layer on the semiconductor substrate 101 and patterning the silicon nitride layer by using a patterned photoresist layer.

Figure 2C:
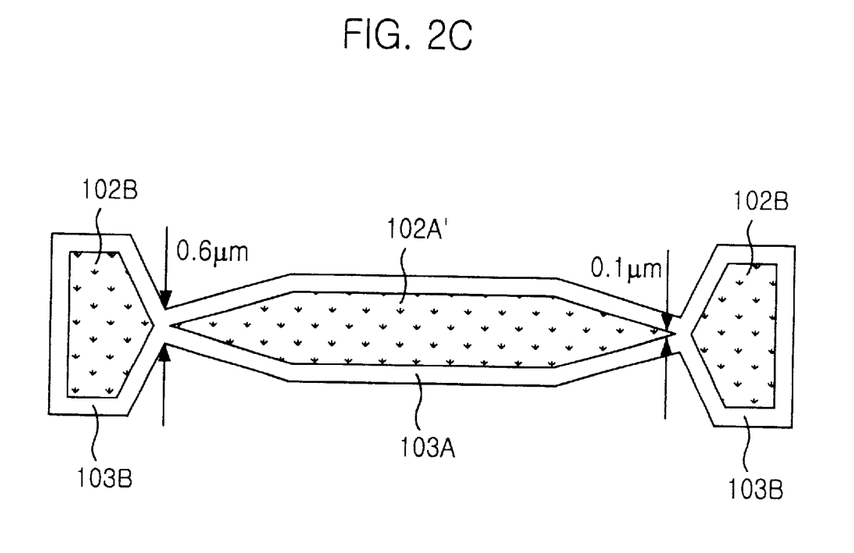

FIG. 2C is a top plan view setting forth a structure obtained by sequentially applying a dry and an wet etching to the waveguide layer 102 in FIG. 2B using the patterned photoresist layer 103 as an etching mask. Therefore, the waveguide layer 102 is converted into a tapered waveguide 102A and a pair of isolated pads 102B. The present invention implements the tapered waveguide 102A having end tips its size approximately 0.1 µm in width. This is achieved by employing the strain distributed pads 103B during the etching of the waveguide layer 102. That is, by employing the strain distribution pads 103B, the strain caused along a lateral direction of the lateral-tapered portion 103A can be distributed to the strain distributed pads 103A. In this result, end tips of the tapered waveguide 102A are sharp and clear in shape to utilize the tapered waveguide 102A as a spot size converter. In the preferred embodiment, if a width of the lateral-tapered portion 103A is approximately 0.6 µm, a width of the tapered waveguide 102A is approximately 0.1 µm.

Figure 2D:
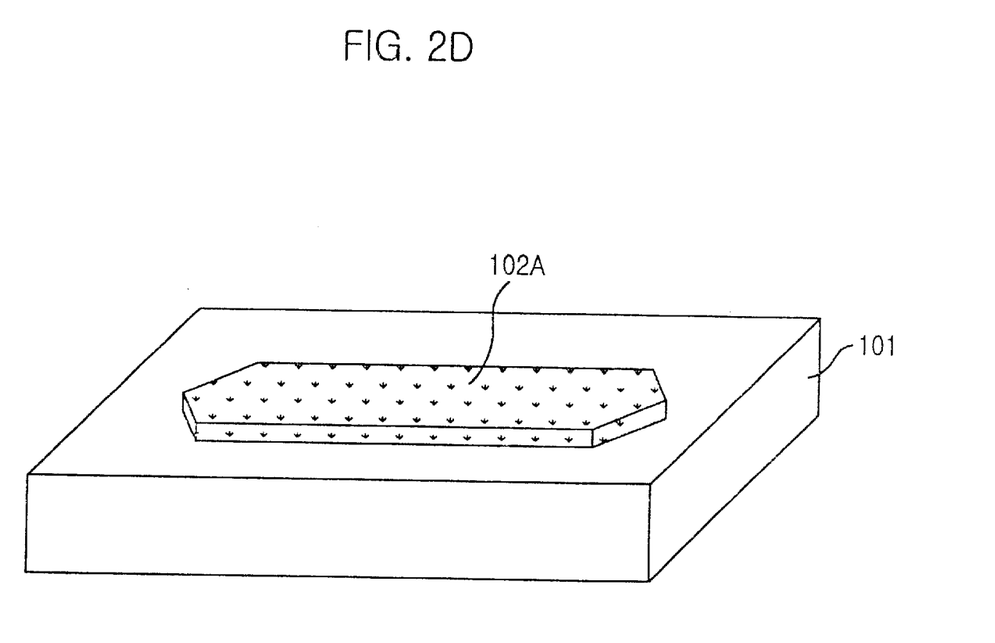

After the above step, the strain distributed pads 103B are removed and subsequently portions of the waveguide layer 102B corresponding to the strain distributed pads 103B are removed by using an etching process, thereby obtaining the tapered waveguide 102A, as shown in FIG. 2D.

As mentioned above, the present invention provides the laterally-tapered shape 150A and a pair of pads 150B on the reticle 150, thereby having the ability to prevent a crumble or looseness of a distal end which may be frequently occurred during the typical lithographic process, form a tapered distal end of up to 0.6 µm in width on the order of a resolution of the contact exposure equipment, and fabricate a tapered distal end having a smooth and reproducibility in a width of 0.1 µm in width by a slight wet etching even.

FIGS. 4A to 4E are cross sectional views setting forth a method for manufacturing a spot-size converter in accordance with a preferred embodiment of the present invention, respectively.

Figure 4A:
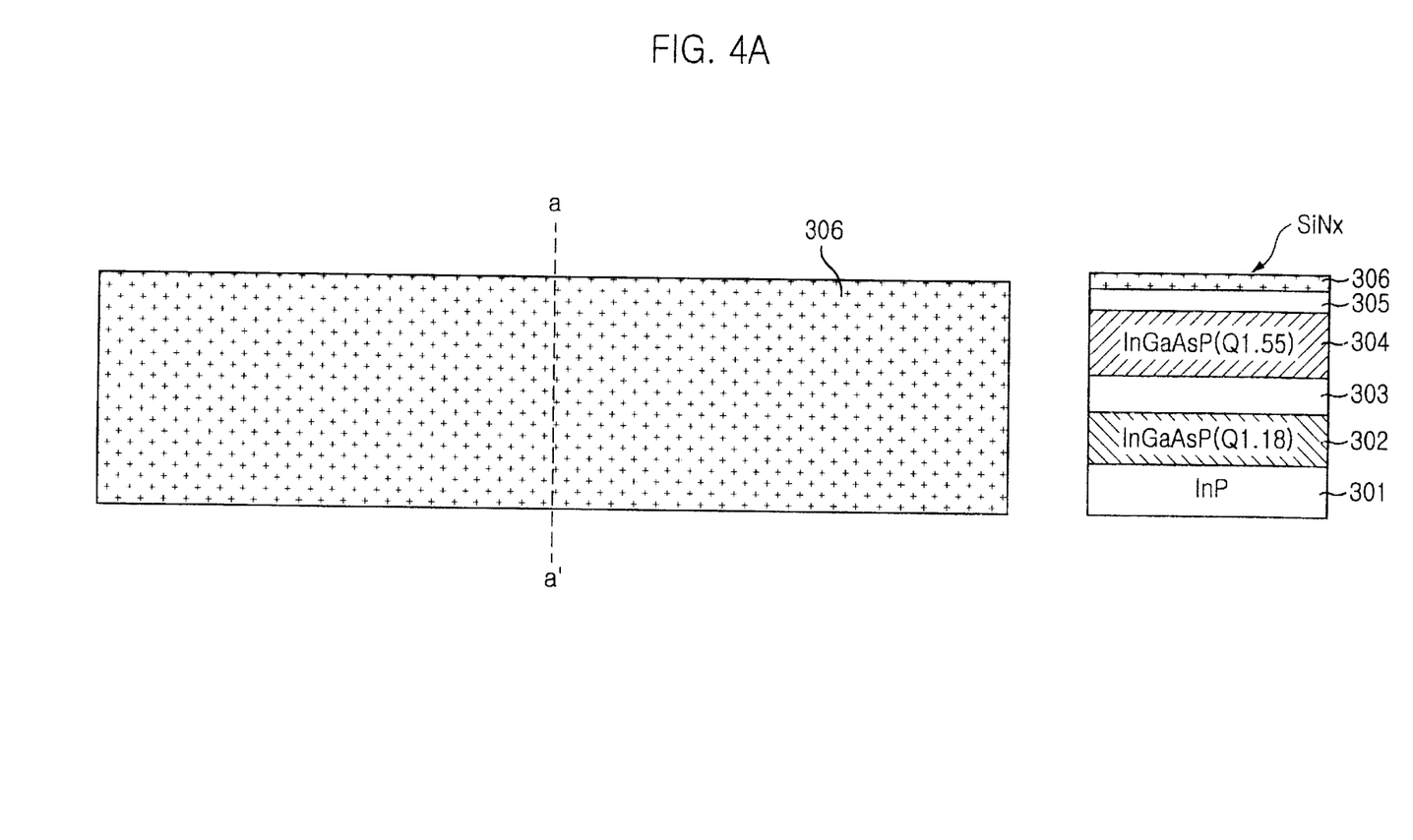
FIGS. 4A to 4E are cross sectional views setting forth a method for manufacturing an optical device in accordance with a preferred embodiment of the present invention, respectively.

In FIG. 4A, a first waveguide layer 302, e.g., made of a material such as InGaAsP (Q=1.18) formed on a semiconductor substrate 301, e.g., made of a material such as InP. Subsequently, a first cladding layer 303, e.g., made of a material such as InP, a second waveguide layer 304, e.g., made of a material such as InGaAsP (Q=1.55) and a second cladding layer 305, e.g., made of a material such as InP, are formed on the first waveguide layer 302. And then, a silicon nitride (SiNx) layer 306 is formed on top of the second cladding layer 305 by using a plasma enhanced chemical vapor deposition (PECVD) to create a mask for lithography. In FIG. 4A, the right represents a top plan view of the structure formed as the above and the left represents a sectional view taken on line A–A' in the right view. A thickness and width of the first waveguide layer 302 are in the ranges from 0.1 to 0.3 µm and from 3 to 10 µm, respectively. The second waveguide layer 304 is disposed from the first waveguide layer 302 by 0.1 to 0.5 µm and has a thickness of 0.1 to 0.3 µm.

Figure 4B:
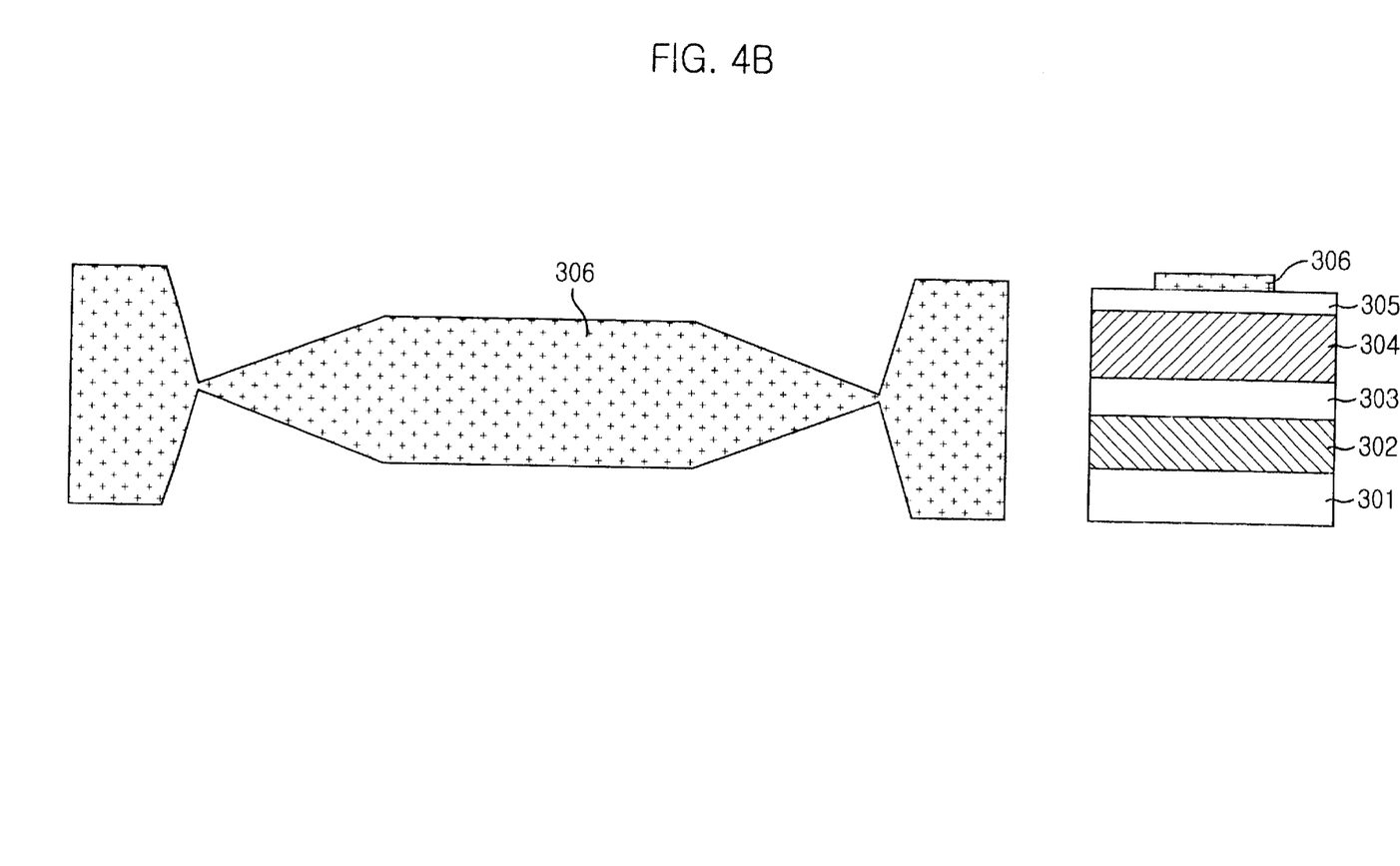

As shown in FIG. 4B, the silicon nitride film 306 is patterned by using the reticle 150, as shown in FIG. 2. Specifically, a photoresist pattern, being a positive type, is formed on the silicon nitride film 306, and then the silicon nitride film 306 is etched by using a Magnetically Enhanced Reactive Ion Etching (MERIE) method.

Figure 4C:
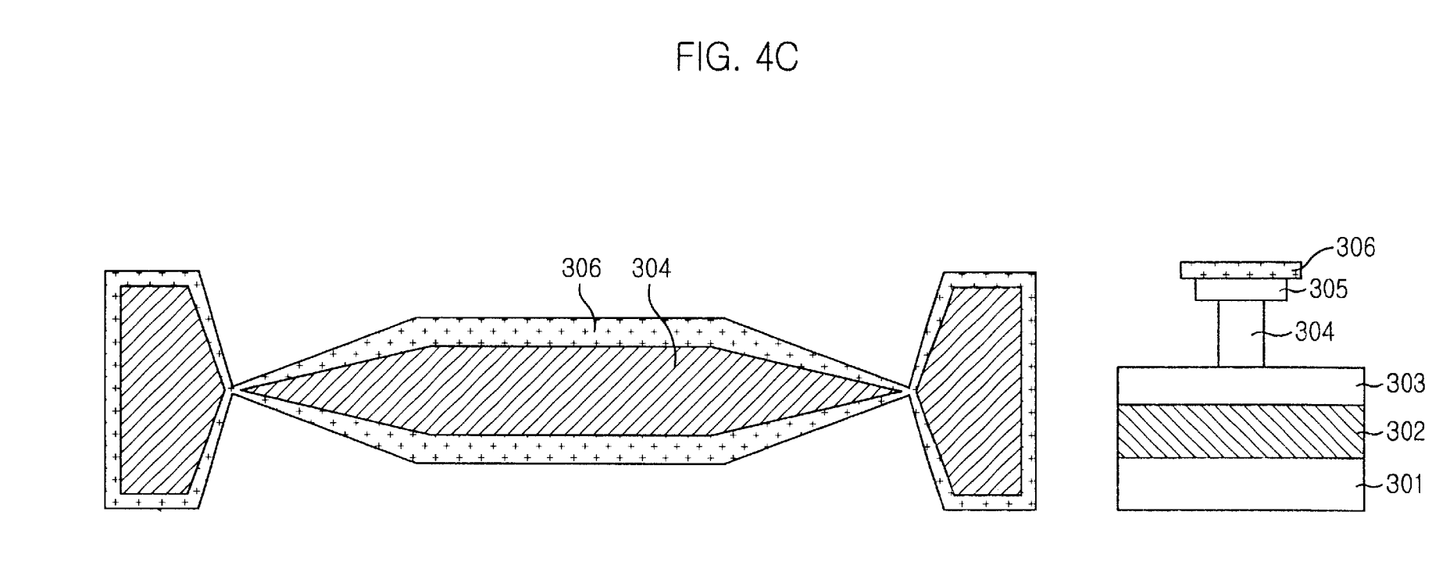

In a subsequent step, as shown in FIG. 4C, the second cladding layer 305 is removed by using the patterned silicon nitride film 306 wherein a hydrochloric acid-based etchant is used during the removal. Thereafter, the second waveguide layer 304 is removed using a sulfuric acid-based etchant. Since the sulfuric acid-based etchant has an etching rate considerably higher than InP, the etching is stopped at an InP layer 303 positioned underneath the second waveguide layer 304. Thus, the second waveguide layer 304 of InGaAsP continuously undergoes a lateral etching until the joint between the lateral-tapered shape region and the pad region is disconnected, as shown in FIG. 3C.

Figure 4D:
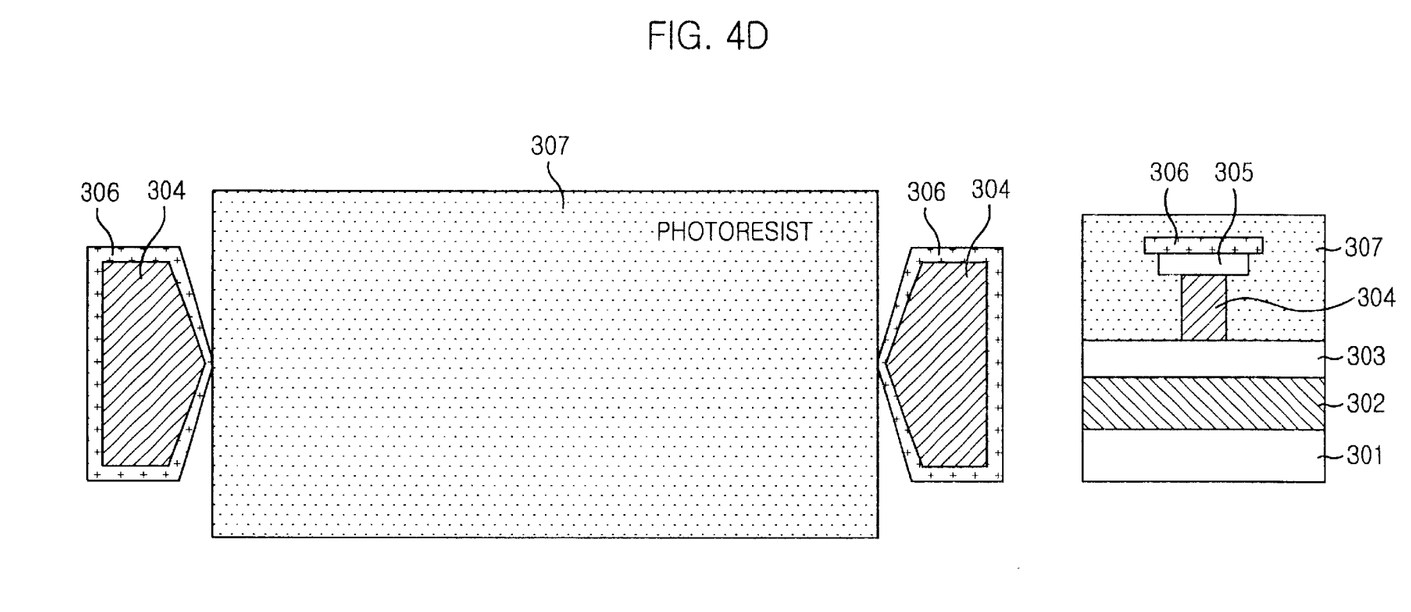

After that, as shown in FIG. 4D, the tapered region is masked with a photoresist pattern 307 to etch the silicon nitride film 306, the second cladding layer 305 and the second waveguide layer 304, thereby removing pattern regions corresponding to the strain distributed pads. The reason that removes the pattern regions is that a dispersion and absorption of light beam are generated due to the pattern region corresponding to the pads, before the light beam that passes through the first waveguide layer 302 is reached to the spot-size converter.

Figure 4E:
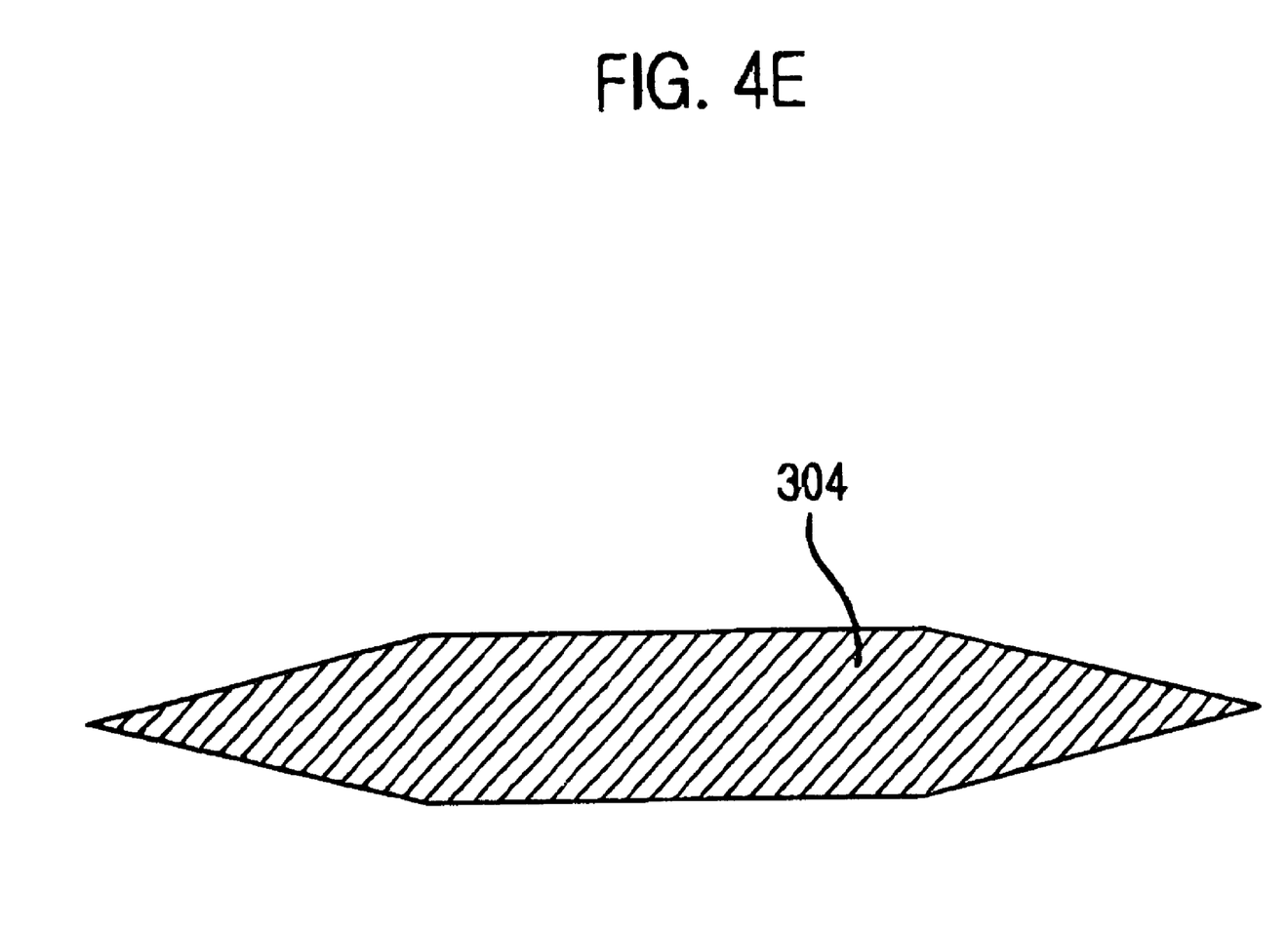

FIG. 4E is a top plan view of a final lateral-tapered waveguide which is finished through the above processes.

Figure 5:
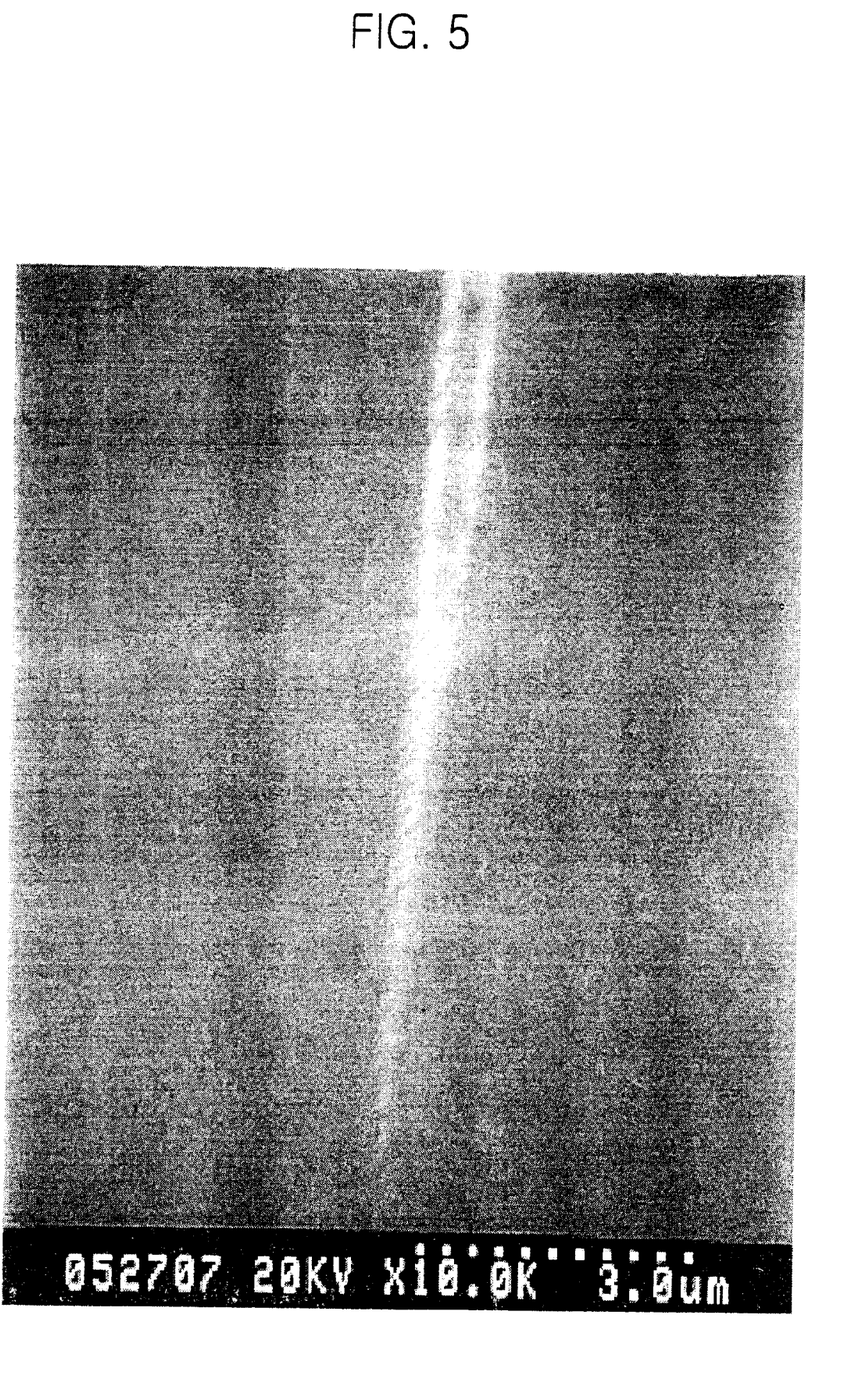
FIG. 5 is a scanning-electron-microscope (SEM) photograph for the spot-size converter fabricated by the method of the present invention.

In accordance with the present invention, experiments has shown that it is possible to manufacture the spot-size converter which has a smooth and reproducibility and also an uniform width of below 0.1 µm. FIG. 5 is a scanning-electron-microscope (SEM) photograph for the spot-size converter fabricated by the method of the present invention.

As can be seen from the SEM photograph in FIG. 5, the distal end has a width of below 300 Å and has a very uniform width, which directly influences the yield of the optical device.

Subsequent processes include a waveguide formation process and a current isolation process such as a process for the fabrication of most optical devices having a double-waveguide structure. Specifically, the processes involves: depositing a silicon nitride film over the whole area once more; forming a straight band of silicon nitride film as an active layer by using the photolithographic and MERIE etching processes; conducting the RIE etching process on a structure obtained from the above; determining a current isolation layer and an injection layer according on a type of the optical device and using a regrowth method. Thus, it is possible to fabricate a wanted optical device. Further, the optical device may be fabricated through the use of etching processes such as a dry etching other than the selective etching process utilized in the present invention.

Figure 6:
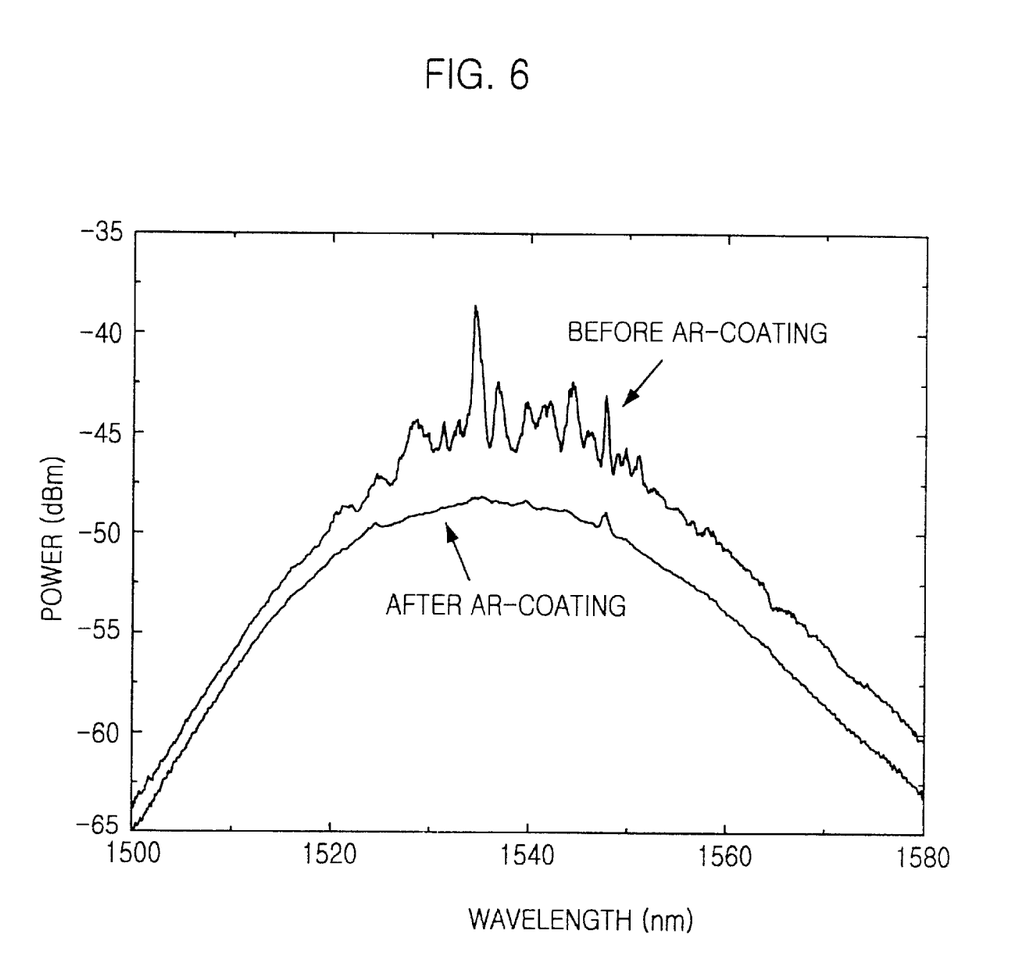
FIG. 6 is a graphical representation setting forth a problem non-uniform characteristic of an amplified spontaneous emission (ASE) spectrum according to defaults of the spot-size converter in a semiconductor optical amplifier.

FIG. 6 is a graphical representation setting forth the experiment results in which a problem occurred by defaults of the spot-size converter is shown during the fabrication of a semiconductor optical amplifier with a high non-linearity. In FIG. 6, the upper solid line B represents that non-uniform peaks are presented on an amplified spontaneous emission (ASE) spectrum of the fabricated semiconductor optical amplifier and the lower solid line R represents an ASE spectrum which is obtained after coating the semiconductor optical amplifier with a non-reflection film. As can be appreciated from FIG. 6, most of the non-uniform peaks presented on the center in the upper solid line B have been removed with the help of the non-reflecting film coating. The reason the non-uniformity is removed is that a reflection in the distal end of the spot-size converter integrated with the semiconductor optical amplifier and the section of the optical device forms a resonator which causes the non-uniformity of the ASE spectrum B as shown in FIG. 6, resulting in a suddenly degraded section reflexibility of the semiconductor optical amplifier after the coating, which in turn, renders the formation of the resonator difficult. Unfortunately, the removal may cause a serious problem during an actual optical packaging, because the resonator is created between the section of the optical fiber and the distal end of the mode conversion during the optical packaging, resulting in a degraded property of the optical device. Accordingly, in the manufacture of the optical device, it is necessary to fabricate the spot-size converter having the distal end with a very smooth and a width of below 0.2 $\mu$m to decrease the reflection at the distal end of the spot-size converter. In addition, FIG. 6 shows that the reflection has a direct influence on an amplification property of the semiconductor optical amplifier.

Figure 7:
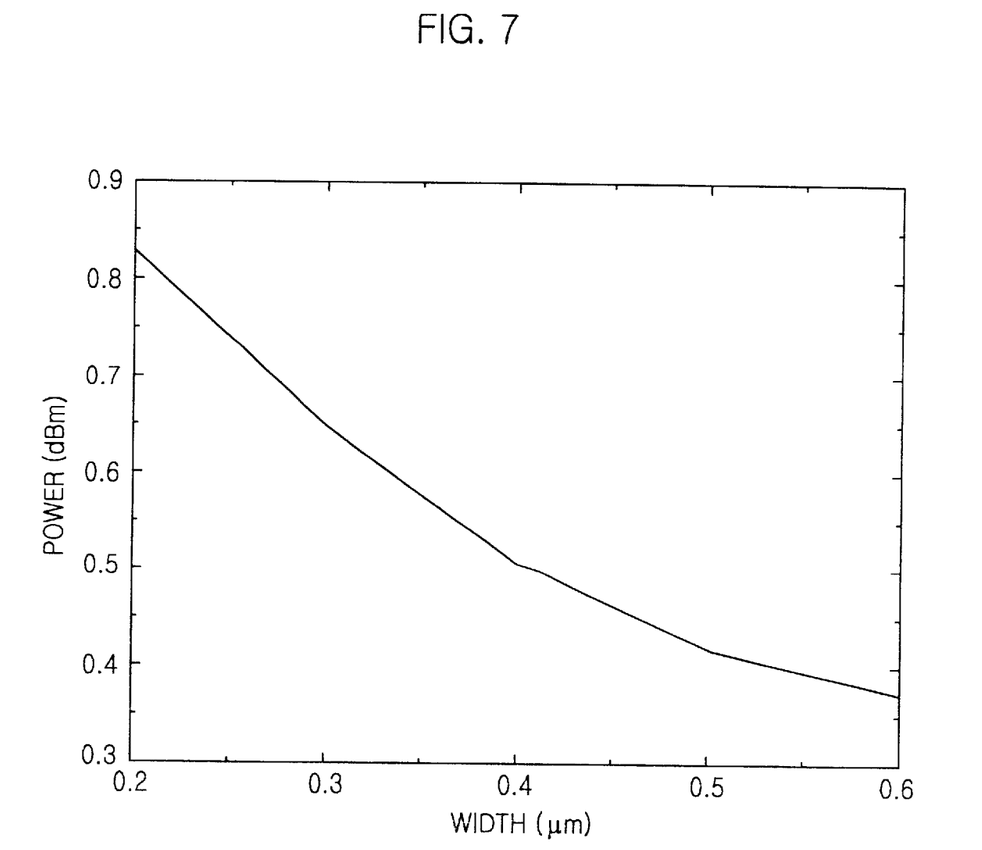
FIG. 7 shows the results obtained by a three-dimensional Beam Propagation Method (BPM) simulation for the influence of a width of tapered distal end on a coupling efficiency.

FIG. 7 shows the results obtained by a three-dimensional Beam Propagation Method (BPM) simulation for the influence of the width of the tapered distal end on the coupling efficiency.

In case a structure wherein incoming and outgoing parts in the optical waveguide have $W_{in}$=3.0 $\mu$m and $W_{out}$=1.2 $\mu$m in width, and $d_{in}$=0.15 $\mu$m and $d_{out}$=0.4 $\mu$m (including SCH region) in thickness, respectively a distance between the incoming and outgoing parts is g=0.3 $\mu$m; a passive and an active refractive index are $n_{in}$=3.36 and $n_{out}$=3.55 respectively; and a refractive index of clad is $n_o$=3.17, the resultant data obtained by performing a three-dimensional BPM simulation on a tapered length of 150 $\mu$m is shown in FIG. 6. The influence of the width of the tapered distal end on the coupling efficiency can be appreciated from FIG. 6. As can be also seen from FIG. 6, the width of the distal end should be set to be 0.2 $\mu$m so as to implement the spot-size converter with a coupling efficiency of above 90% for the tapered length of above 150 $\mu$m.

As demonstrated above, the present invention has the ability to fabricate an integrated optical device with a spot-size converter by utilizing the contact exposure equipment and the wet etching technique in the prior art, thereby leading to decrease in cost and term during packaging of an optical device and lowering a section reflexibility with the help of an enlarged mode, which in turn, prevents properties of the optical device from being deteriorated by the reflected light. Furthermore, the present invention has merits in optical device packaging applications and a single integration. As an example, applying the method of the present invention in the manufacture of a semiconductor optical amplifier, it is possible to fabricate a high quality of optical amplifier at a high yield using the conventional contact exposure equipment. In short, the present invention has considerable advantages in an economic aspect as well as a waveguide share aspect.

Further, the present invention performs a lithographic process using the mask in which a pad that can absorb strain to be occurred during forming the lateral-tapered waveguide pattern is formed at the distal end of the lateral-tapered waveguide, to thereby form the distal end with a width of about 0.6 $\mu$m and then form the lateral-tapered waveguide with a substantial uniformity on the order of 0.1 $\mu$m using an anisotropic etching.

The present invention has the ability to reduce a fabrication cost because it is free from high-resolution electron beam lithography and a stepper, and hence enhance a reproducibility of the lateral-tapered waveguide because it is free from an excessive wet etching during the use of the contact exposure equipment.

Further, the present invention integrates the spot-size converter with lateral-tapered structure fabricated by the above with an optical device, resulting in an increased position adjustment and reproducibility of the spot-size converter, which in turn, leads to increase in yield for the optical device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing an optical device, comprising the steps of:
   a) forming a waveguide layer on a semiconductor substrate;
   b) forming a mask layer and patterning the mask layer into a predetermined configuration in such a way that the predetermined configuration has a taper portion at its both distal ends and a pair of strain distributed pads;
   c) etching the waveguide layer using the patterned mask layer as an etching mask; and
   d) removing the patterned mask layer and subsequently removing portions of the waveguide layer corresponding to the strain distributed pads, thereby obtaining a tapered waveguide.

2. The method of claim 1, wherein if an end tip of the tapered portion is approximately 0.6 $\mu$m in width, the tapered waveguide has its distal ends approximately 0.1 $\mu$m in width.

3. The method of claim 1, wherein the step c) is carried out by using a dry etching, a wet etching, or a combination thereof.

4. The method of claim 1, wherein the mask layer includes a photoresist.

5. The method of claim 1, wherein the mask layer includes a silicon nitride.

6. A method for the fabrication of a spot-size converter, comprising the steps of:
   a) forming a first waveguide layer, a first cladding layer, a second waveguide layer and a second cladding layer on a semiconductor substrate, sequentially;
   b) forming a mask layer on the second cladding layer and patterning the mask layer into a predetermined configuration in such a way that the predetermined configuration has a taper portion at its both distal ends and a pair of strain distributed pads;
   c) etching the second cladding layer and the second waveguide layer by using the patterned mask layer as an etching mask; and
   d) removing the patterned mask layer and subsequently removing portions of the second cladding layer and the second waveguide layer corresponding to the strain distributed pads, thereby obtaining a tapered waveguide on top of the first cladding layer.

7. The method of claim 6, wherein if an end tip of the tapered portion is approximately 0.6 $\mu$m in width, the tapered waveguide has its distal ends approximately 0.1 $\mu$m in width.

8. The method of claim 6, wherein the step c) is carried out by using a dry etching, a wet etching, or a combination thereof.

9. The method of claim 6, wherein the mask layer includes a photoresist.

10. The method of claim 6, wherein the mask layer includes a silicon nitride film.

11. An optical device, which is manufactured by the following steps of:
    forming a waveguide layer on a semiconductor substrate;
    b) forming a mask layer and patterning the mask layer into a predetermined configuration in such a way that the predetermined configuration has a taper portion at its both distal ends and a pair of strain distributed pads;
    c) etching the waveguide layer using the patterned mask layer as an etching mask; and
    d) removing the patterned mask layer and subsequently removing portions of the waveguide layer corresponding to the strain distributed pads, thereby obtaining a tapered waveguide.

12. An optical device, which is manufactured by the following steps of:
    a) forming a first waveguide layer, a first cladding layer, a second waveguide layer and a second cladding layer on a semiconductor substrate, sequentially;
    b) forming a mask layer on the second cladding layer and patterning the mask layer into a predetermined configuration in such a way that the predetermined configuration has a taper portion at its both distal ends and a pair of strain distributed pads;
    c) etching the second cladding layer and the second waveguide layer by using the patterned mask layer as an etching mask; and
    d) removing the patterned mask layer and subsequently removing portions of the second cladding layer and the second waveguide layer corresponding to the strain distributed pads, thereby obtaining a tapered waveguide on top of the first cladding layer.

13. A reticle for manufacturing an optical device of claim 1, comprising a lateral-tapered shape at its both distal ends and a pair of pads connected to the distal ends.

14. A reticle for manufacturing an optical device of claim 6, comprising a lateral-tapered shape at its both distal ends an a pair of pads connected to the distal ends.

* * * * *